(12) United States Patent
Lu et al.

(10) Patent No.: US 7,034,628 B1
(45) Date of Patent: Apr. 25, 2006

(54) CRYSTAL OSCILLATOR CIRCUIT HAVING A START-UP TIME REDUCTION CIRCUIT

(75) Inventors: Weiye Lu, Sunnyvale, CA (US); Thomas Tse, Santa Clara, CA (US); Wai Cheong Chan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 62 days.

(21) Appl. No.: 10/871,912

(22) Filed: Jun. 18, 2004

(51) Int. Cl.
*H03B 5/32* (2006.01)
*H03L 5/00* (2006.01)

(52) U.S. Cl. .................. 331/158; 331/160; 331/183
(58) Field of Classification Search ............... 331/158, 331/182, 57, 160, 183
See application file for complete search history.

(56) References Cited

U.S. PATENT DOCUMENTS

| 4,328,571 | A | | 5/1982 | Noble ......................... 368/87 |
| 4,704,587 | A | | 11/1987 | Ouyang et al. ......... 331/116 FE |
| 5,041,802 | A | | 8/1991 | Wei et al. ............... 331/116 FE |
| 5,331,296 | A | | 7/1994 | Davis ......................... 331/158 |
| 5,544,120 | A | * | 8/1996 | Kuwagata et al. .......... 365/222 |
| 5,909,152 | A | | 6/1999 | Li et al. ................. 331/116 FE |
| 6,018,219 | A | * | 1/2000 | Komarek et al. ........... 315/194 |
| 6,057,742 | A | | 5/2000 | Prado ........................... 331/158 |
| 6,100,768 | A | * | 8/2000 | Hirayama ..................... 331/57 |

* cited by examiner

*Primary Examiner*—Robert Pascal
*Assistant Examiner*—James Goodley
(74) *Attorney, Agent, or Firm*—Mark C. Pickering

(57) ABSTRACT

A quartz-crystal oscillator circuit substantially reduces the start-up time of the crystal oscillator circuit by utilizing a start-up time reduction circuit that adds additional gain to the crystal oscillator circuit during the start-up period, and removes the additional gain as the oscillator circuit nears steady state operation. Furthermore, the start-up time reduction circuit dynamically monitors the oscillation amplitude. If the build up of oscillation is interrupted, the additional gain will be re-applied.

24 Claims, 4 Drawing Sheets

CRYSTAL OSCILLATOR CIRCUIT HAVING A START-UP TIME REDUCTION CIRCUIT

BACKGROUND OF THE INVENTION

1. Field of the Invention

The present invention relates to crystal oscillator circuits and, more particularly, to a crystal oscillator circuit that has a start-up time reduction circuit.

2. Description of the Related Art

An oscillator is a circuit that outputs a periodic signal. FIG. 1 shows a schematic diagram that illustrates a prior-art, quartz-crystal oscillator circuit 100. As shown in FIG. 1, crystal oscillator circuit 100, which is also known as a Pierce oscillator, includes a crystal circuit 110 that has a quartz crystal 112 and a bias resistor R.

Quartz crystal 112, in turn, has a first terminal that is connected to a first node N1, and a second terminal that is connected to a second node N2. Further, bias resistor R also has a first terminal that is connected to the first node N1, and a second terminal that is connected to the second node N2.

In addition, crystal oscillator circuit 100 includes a first capacitor 114 that has a first plate connected to the first node N1 and a second plate connected to ground, and a second capacitor 116 that has a first plate connected to the second node N2 and a second plate connected to ground.

Crystal oscillator circuit 100 further includes a logic device 120 that has an odd number of serially-connected inverters, including a first inverter 120A that is connected to the first node N1, a last inverter 120B that is connected to the second node N2, and a next-to-last inverter 120C that is connected to last inverter 120B. Logic device 120 also has an output inverter 120D that is connected to the input of last inverter 120B to output a clock signal CLK.

In operation, when power is first applied, crystal oscillator circuit 100 produces an oscillating signal OS on the first node N1 that builds in magnitude over a period of time until the magnitude of the oscillating signal OS reaches a final steady state level. A start-up period, in turn, is typically defined as the time from when power is first applied to when the magnitude of the oscillating signal reaches approximately 85%–90% of the final steady state level.

FIG. 2 shows a timing diagram that illustrates the start-up period of crystal oscillator circuit 100. During power up, noise is amplified by oscillator circuit 100. As shown in FIG. 2, through the filtering property of the quartz crystal, only the natural frequency of the crystal is amplified to produce an oscillating signal OS, while the other frequencies are attenuated. As further shown in FIG. 2, oscillating signal OS has an envelope 210 that builds in magnitude over the start-up period, which extends from time t0 to time t1.

In many applications, a shorter start-up time is desirable. One approach to reducing the start-up time of a crystal oscillator circuit is to increase the gain in the crystal oscillator circuit. Increasing the gain to reduce the start-up time, however, can hasten the aging of the crystal, and hence prematurely degrade the accuracy and reliability of the crystal.

Another approach to reducing the start-up time of a crystal oscillator circuit is to provide additional gain during the start-up period, and then shut off the additional gain after the oscillation has been deemed to be "stable" (e.g., reached approximately 85%–90% of the final steady state level). Since the extra gain is provided only during the start-up period, the negative effect on the crystal is relatively minor.

However, one problem with the prior approaches to providing additional gain only during the start-up period is that these prior approaches lack any mechanism to re-apply the extra gain to aid the build up of oscillation if the determination of a "stable" oscillation is incorrect, or for any reason the oscillation is interrupted. Thus, there is a need for an approach to reducing the start-up time of a quartz-crystal oscillator circuit that eliminates the above limitations.

DETAILED DESCRIPTION OF THE INVENTION

Figure 3:
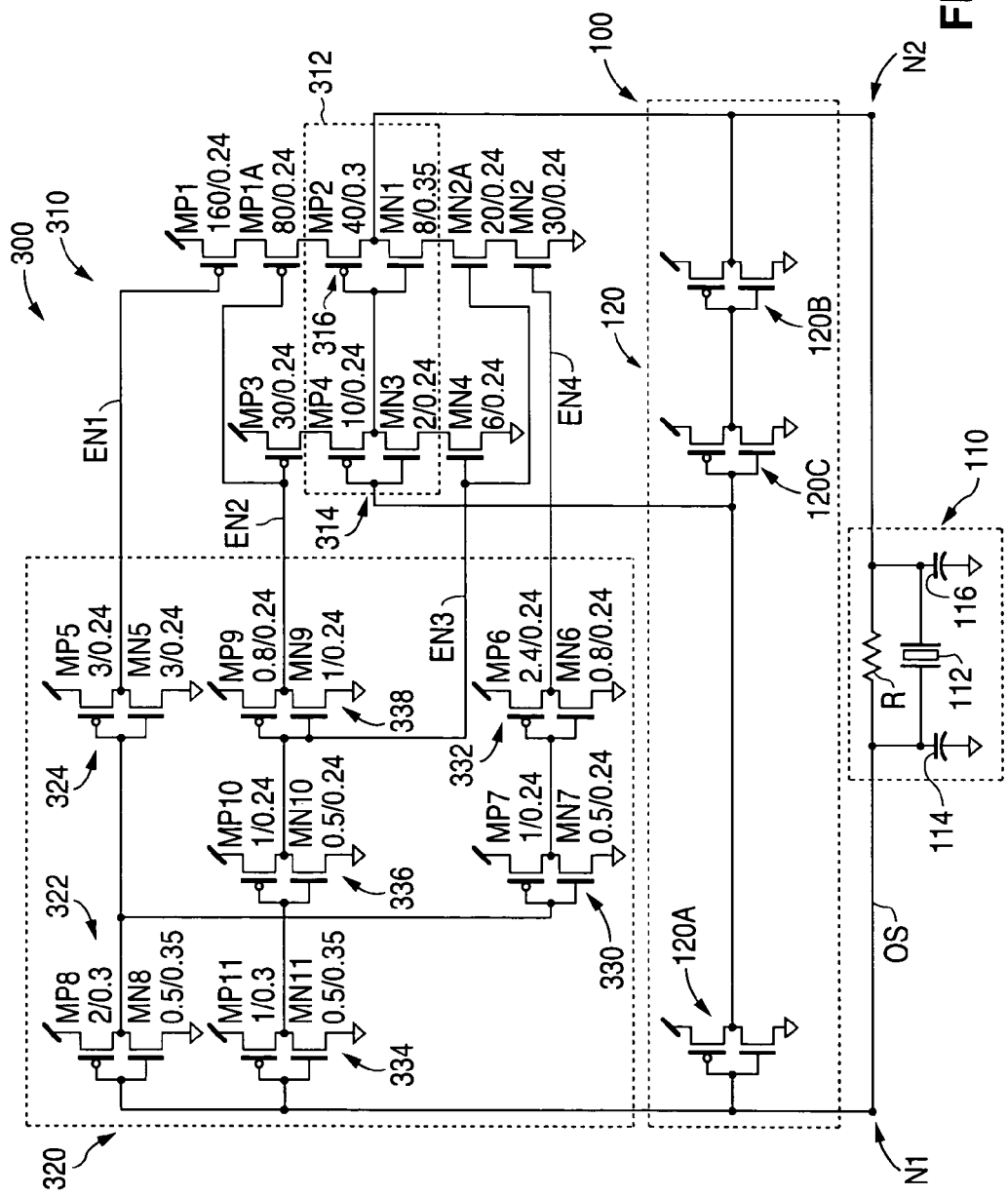
FIG. 3 is a schematic diagram illustrating an example of a quartz-crystal oscillator circuit 300 in accordance with the present invention.

FIG. 3 shows a schematic diagram that illustrates an example of a quartz-crystal oscillator circuit 300 in accordance with the present invention. As described in greater detail below, crystal oscillator circuit 300 substantially reduces the start-up time by providing additional gain only during the start-up period (when the oscillation is building toward a steady state level).

In addition, crystal oscillator circuit 300 dynamically monitors the oscillation of circuit 300. As a result, even if the oscillation collapses following the start-up period after the additional gain has been shut off, circuit 300 dynamically responds to the reduction of oscillation and turns on the additional gain again.

Crystal oscillator circuit 300 is similar to crystal oscillator circuit 100 and, as a result, utilizes the same reference numerals to designate the structures which are common to both circuits. As shown in FIG. 3, crystal oscillator circuit 300 differs from crystal oscillator circuit 100 in that circuit 300 includes a start-up time reduction circuit 310 that is connected to logic device 120. Circuit 310 provides additional gain when the magnitude of the voltage on the first node N1 is within a pre-determined range, such as within 10% to 90% of a final steady state level.

As further shown in FIG. 3, start-up time reduction circuit 310 includes a gain stage 312 that has two serially-connected inverters that lie in parallel with the last two inverters of logic device 120 such that the input of the first inverter of the last two inverters of logic device 120 and the input of the first inverter of gain stage 312 are connected together.

In addition, the output of the last inverter of logic device 120 and the output of the last inverter of gain stage 312 are connected together and to node N2. In the FIG. 3 example, gain stage 312 is implemented with inverter 314 (which has a PMOS transistor MP4 and an NMOS transistor MN3) and inverter 316 (which has a PMOS transistor MP2 and an NMOS transistor MN1).

In addition to gain stage 312, start-up time reduction circuit 300 also includes a plurality of control transistors that control gain stage 312. The control transistors include a PMOS control transistor MP3 that is connected to PMOS transistor MP4 and a supply voltage, and an NMOS control transistor MN4 that is connected to NMOS transistor MN3 and ground.

The control transistors also include a PMOS control transistor MP1A that is connected to PMOS transistor MP2, and an NMOS control transistor MN2A that is connected to NMOS transistor MN1. Further, the control transistors include a PMOS control transistor MP1 that is connected to PMOS transistor MP1A and the supply voltage, and an NMOS control transistor MN2 that is connected to NMOS transistor MN2A and ground.

As further shown in FIG. 3, start-up time reduction circuit 310 also includes a control circuit 320 that receives the oscillating signal OS on the first node N1, and sets the logic states of a number of enable signals EN1–EN4, which are output to the control transistors, to enable inverters 314 and 316 via the control transistors when the magnitude of the oscillating OS is building up (e.g., is still within 10%–90% of the final steady state level).

In the FIG. 3 example, control circuit 320 includes an inverter 322, which has a PMOS transistor MP8 and an NMOS transistor MN8. In accordance with the present invention, inverter 322 is sized (2/0.3 PMOS, 0.5/0.35 NMOS) to have a trip point that is substantially higher than one-half the supply voltage (VDD/2), such that inverter 322 changes the output from a logic high to a logic low when the magnitude of the oscillating signal OS on the first node N1 exceeds the trip point. Ideally, the trip point of inverter 322 would be equal to 85%–90% of the final steady state level of the oscillating signal OS.

Control circuit 320 additionally includes an inverter 324, which has a PMOS transistor MP5 and an NMOS transistor MN5. Inverter 324, which is connected to inverter 322, outputs the enable signal EN1 to PMOS control transistor MP1. In addition, control circuit 320 also includes an inverter 330, which has a PMOS transistor MP7 and an NMOS transistor MN7, and an inverter 332, which has a PMOS transistor MP6 and an NMOS transistor MN6. Inverter 332, which is connected to inverter 330, outputs the enable signal EN4 to NMOS control transistor MN2.

Further, control circuit 320 includes an inverter 334, which has a PMOS transistor MP11 and an NMOS transistor MN11. In accordance with the present invention, inverter 334 is sized (1/0.3 PMOS, 0.5/0.35 NMOS) to have a trip point which is significantly lower that VDD/2 such that a small magnitude of the oscillating signal OS is enough to cause inverter 334 to change the output from a logic high to a logic low.

Control circuit 320 additionally includes an inverter 336, which has a PMOS transistor MP10 and an NMOS transistor MN10. Inverter 336, which is connected to inverter 334, outputs the enable signal EN3. Further, control circuit 320 includes an inverter 338, which has a PMOS transistor MP9 and an NMOS transistor MN9. Inverter 338, which is connected to inverter 336, outputs the enable signal EN2.

During the start-up period, the magnitude of the oscillating signal OS on the first node N1 is greater than the trip point of inverter 334, but less than the trip point of inverter 322. Thus, since the magnitude of the oscillating signal OS is insufficient to trip inverter 322, control transistors MP1 and MN2 are turned on. In addition, since the magnitude of the oscillating signal OS is sufficient to flip inverter 334, the enable signal EN3 output by inverter 336 is, therefore, high. When the enable signal EN3 is high, control transistors MN2A and MN4 respond by turning on.

Further, inverter 338 inverts the signal output by inverter 336 to output the enable signal EN2. Since the enable signal EN3 is high and the enable signal EN2 is low, control transistors MP1A and MP3 respond by turning on. Thus, when power is first applied, transistors MP1, MP1A, MN2, MN2A, MP3, and MN4 are all turned on when the magnitude of the voltage of the first node N1 is greater than the trip point of inverter 334 and less than the trip point of inverter 322.

When transistors MP1, MP1A, MN2, MN2A, MP3, and MN4 are all turned on, the enable signals EN1–EN4 are active and gain stage 312 is added in parallel to logic device 120. When gain stage 312 is added in parallel, the start-up time can be significantly reduced.

Figure 4:
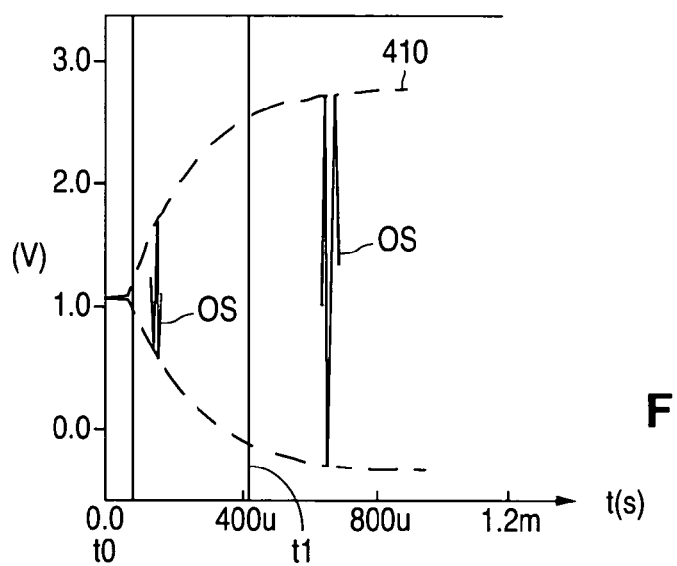
FIG. 4 is a timing diagram of a simulation result illustrating an example of a start-up period of crystal oscillator circuit 300 in accordance with the present invention.

FIG. 4 shows a timing diagram of a simulation result that illustrates an example of a start-up period of crystal oscillator circuit 300 in accordance with the present invention. As shown in FIG. 4, at time t0, circuit 300 begins generating an oscillating signal OS, which has an envelope 410, on the first node N1 when the supply voltage is first applied. During the start-up period, the magnitude of the oscillating signal OS increases until the voltage level reaches 90% of a final steady state level at time t1, approximately 400 uS later in the FIG. 4 example.

Figure 5:
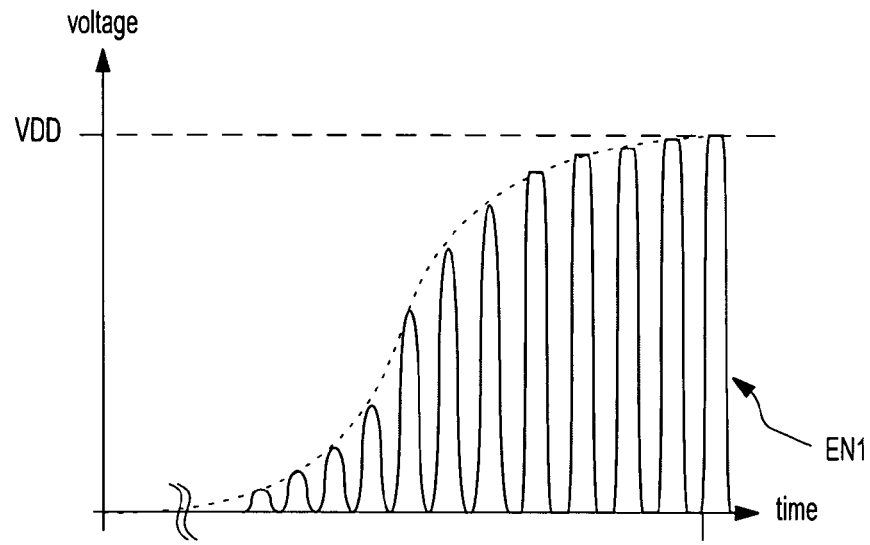
FIG. 5 is a timing diagram illustrating the enable signal EN1 with respect to the oscillating signal OS in accordance with the present invention.

FIG. 5 shows a timing diagram that illustrates the enable signal EN1 with respect to the oscillating signal OS in accordance with the present invention. As shown in FIG. 5, at time t0, when power is first applied, the enable signal EN1 has a logic low which, in turn, enables PMOS control transistor MP1. Thus, before the oscillating signal OS reaches the trip point of inverter 322, PMOS control transistor MP1 is enabled by enable signal EN1.

In addition, as further shown in FIG. 5, when the magnitude of the oscillating signal OS passes the trip point of inverter 322, the enable signal EN1 follows the oscillating signal OS. After this, each time the oscillating signal OS reaches a maximum value, the enable signal EN1 turns off PMOS control transistor MP1.

Figure 6:
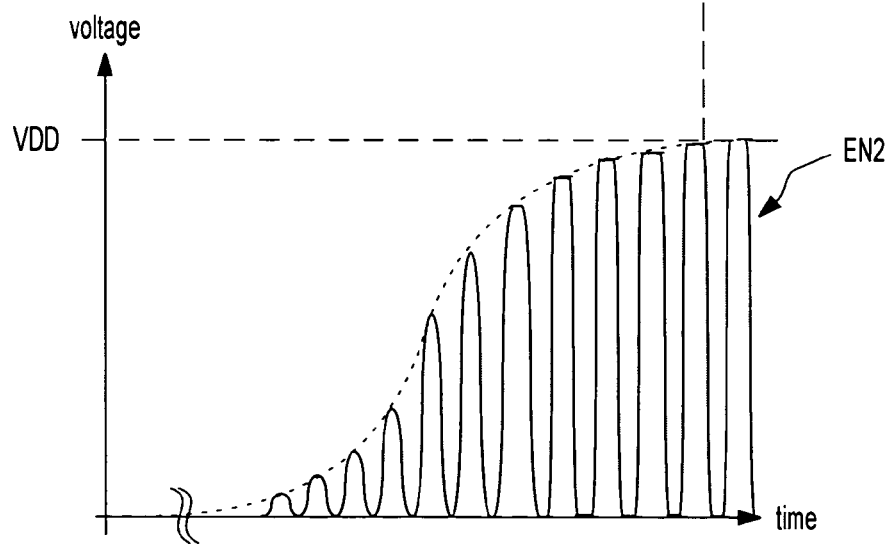
FIG. 6 is a timing diagram illustrating the enable signal EN2 in accordance with the present invention.

FIG. 6 shows a timing diagram that illustrates the enable signal EN2 in accordance with the present invention. As shown in FIG. 6, at time t0, when power is first applied, the enable signal EN2 has a logic low which, in turn, enables PMOS control transistors MP1A and MP3.

In addition, as further shown in FIG. 6, when the magnitude of the oscillating signal OS passes the trip point of inverter 334, the enable signal EN2 is the inverse of the oscillating signal OS. After this, each time the oscillating signal OS reaches a maximum value, the enable signal EN2 turns on PMOS control transistors MP1A and MP3. Further, as shown in FIGS. 5 and 6, the enable signals EN1 and EN2 are out of phase with each other once the magnitude of the oscillating signal OS has built up.

Figure 7:
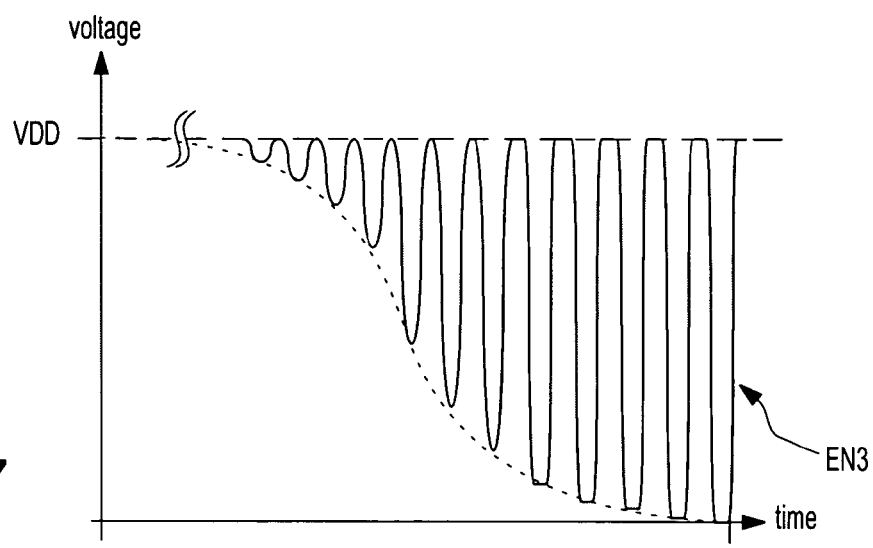
FIG. 7 is a timing diagram illustrating the enable signal EN3 with respect to the oscillating signal OS in accordance with the present invention.

FIG. 7 shows a timing diagram that illustrates the enable signal EN3 with respect to the oscillating signal OS in accordance with the present invention. As shown in FIG. 7, at time t0, when power is first applied, the enable signal EN3 has a logic high which, in turn, enables NMOS control transistors MN2A and MN4

In addition, as further shown in FIG. 7, when the magnitude of the oscillating signal OS passes the trip point of inverter 334, the enable signal EN3 is in phase with the oscillating signal OS. After this, each time the oscillating signal OS reaches a maximum value, the enable signal EN3 has a logic high that turns on NMOS control transistors MN2A and MN4.

Figure 8:
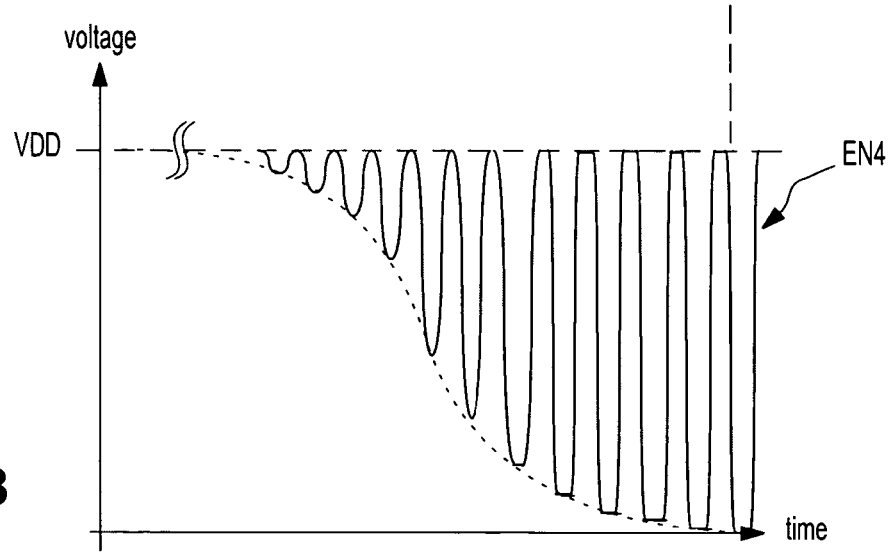
FIG. 8 is a timing diagram illustrating the enable signal EN4 with respect to the oscillating signal OS in accordance with the present invention.

FIG. 8 shows a timing diagram that illustrates the enable signal EN4 with respect to the oscillating signal OS in accordance with the present invention. As shown in FIG. 8, at time t0, when power is first applied, the enable signal EN4 has a logic high which, in turn, enables NMOS control transistor MN2. Thus, before the oscillating signal OS reaches the trip point of inverter 322, NMOS control transistor MN2 is enabled by enable signal EN4.

In addition, as further shown in FIG. 8, when the magnitude of the oscillating signal OS passes the trip point of inverter 322, the enable signal EN4 is out of phase with the oscillating signal OS. After this, each time the oscillating signal OS reaches a maximum value, the enable signal EN4 has a logic low that turns off NMOS control transistor MN2. Further, as shown in FIGS. 7 and 8, the enable signals EN3 and EN4 are out of phase with each other once the magnitude of the oscillating signal OS has built up.

During steady state operation (following the start-up period), when the oscillating signal OS has a minimum value, such as ground, inverter 322 outputs a logic high. Inverter 324 then inverts the logic high to output the enable signal EN1 with a logic low. When the enable signal EN1 goes low, control transistor MP1 responds by turning on.

In addition, inverter 330 inverts the logic high output by inverter 322 to output a logic low, while inverter 332 inverts the logic low output by inverter 330 to output the enable signal EN4 with a logic high. When the enable signal EN4 goes high, control transistor MN2 responds by turning on.

However, even though control transistors MP1 and MN2 are turned on each time the oscillating signal OS has the minimum value, transistors MP1A, MP3, MN2A, and MN4 are turned off because inverter 334 outputs a logic high. When inverter 334 outputs a logic high, inverter 336 outputs the enable signal EN3 with a logic low, and inverter 338 outputs the enable signal EN2 with a logic high.

When the enable signal EN2 goes high, control transistors MP1A and MP3 respond by turning off. Similarly, when the enable signal EN3 goes low, control transistors MN2A and MN4 respond by turning off. Thus, each time the oscillating signal OS has a minimum value, such as ground, start-up time reduction circuit 310 is turned off.

When the oscillation signal OS has a maximum value, such as VDD, inverter 322 outputs a logic low. Inverter 324 then inverts the logic low to output the enable signal EN1 with a logic high. When the enable signal EN1 goes high, control transistor MP1 responds by turning off. In addition, inverter 330 inverts the logic low output by inverter 322 to output a logic high, while inverter 332 inverts the logic high output by inverter 330 to output the enable signal EN4 with a logic low. When the enable signal EN4 goes low, control transistor MN2 responds by turning off. Thus, each time the oscillating signal OS has a maximum value, such as VDD, start-up time reduction circuit 310 is turned off.

Figure 1:
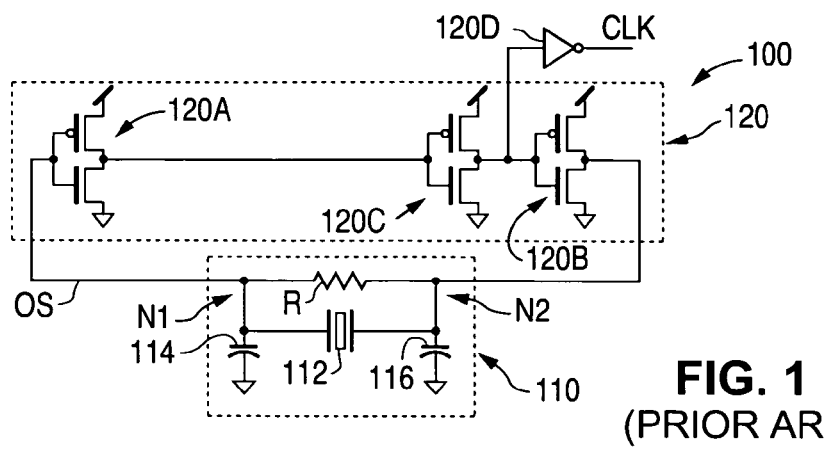
FIG. 1 is a schematic diagram illustrating a prior-art, quartz-crystal oscillator circuit 100.
Figure 2:
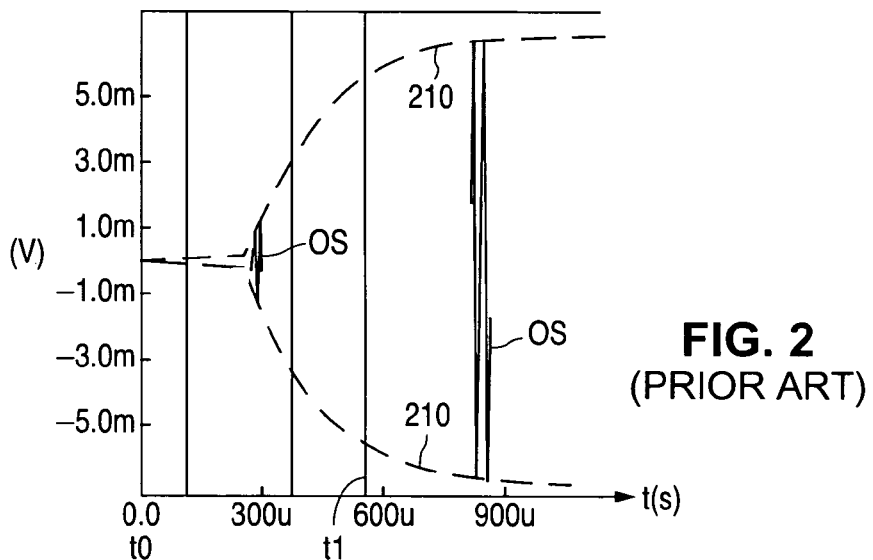
FIG. 2 is a timing diagram illustrating the start-up period of crystal oscillator circuit 100.

One of the advantages of the present invention is that the present invention substantially reduces the start-up time. As shown in FIGS. 2 and 4, the present invention reduces the start-up time from approximately 560 uS, as shown in the FIG. 2 example, to approximately 400 uS as shown in the FIG. 4 example. In addition, when the maximum value of the oscillating signal OS nears the final steady state value, gain stage 312 turns off (as explained above).

Another advantage of the present invention is that if the magnitude of the oscillating signal OS ever falls below the trip point of inverter 322 (and stays above the trip point of inverter 334), circuit 300 responds by re-applying the gain. As shown in FIGS. 5–8, if the oscillation magnitude is reduced, enable signals EN1–EN4 are put back to the conditions when the amplitude of the oscillation is small. Therefore, there is no danger of turning off the extra gain prematurely.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. An oscillator circuit comprising:
   a first node;
   a second node;
   a logic device that includes a number of serially-connected logic blocks, the serially-connected logic blocks having a first logic block that is connected to the first node, and a last logic block that is connected to the second node; and
   a start-up time reduction circuit connected to the first and second nodes, the start-up time reduction circuit having:
   a gain stage that has two serially-connected logic blocks that lie in parallel with the last two logic blocks of the logic device such that an input of a first logic block of the last two logic blocks of the logic device and an input of a first logic block of the gain stage are connected together;
   a plurality of control transistors connected to the gain stage; and
   a control circuit connected to the first node and the control transistors, the control circuit outputting a plurality of enable signals to the control transistors to enable the gain stage only when a magnitude of a voltage on the first node is within a predetermined range.

2. The oscillator circuit of claim 1 wherein the predetermined range is 10% to 90% of a final steady state level.

3. The oscillator circuit of claim 1 wherein an output of the last logic block of the logic device and an output of a last logic block of the gain stage are connected together and to the second node.

4. The oscillator circuit of claim 1 wherein the serially-connected logic blocks are inverters.

5. The oscillator circuit of claim 1 wherein the gain stage includes a plurality of inverting devices that include:
   a first inverting device connected to the input of the first logic block of the last two logic blocks; and
   a second inverting device connected to the second node.

6. The oscillator circuit of claim 5 wherein the plurality of control transistors include:
   a first control transistor connected to the first inverting device and a power supply node;
   a second control transistor connected to the first inverting device and ground;
   a third control transistor connected to the second inverting device;
   a fourth control transistor connected to the second inverting device;
   a fifth control transistor connected to the third control transistor and a power supply node; and
   a sixth control transistor connected to the fourth control transistor and ground.

7. The oscillator circuit of claim 6 wherein the third control transistor is connected to the first control transistor, and the fourth control transistor is connected to the second control transistor.

8. The oscillator circuit of claim 6 wherein the control circuit includes:
a third inverting device connected to the first node, the third inverting device changing an output from a logic high to a logic low when the magnitude of the voltage on the first node exceeds the predetermined range; and
a fourth inverting device connected to the first node, the fourth inverting device changing an output from a logic high to a logic low when the magnitude of the voltage on the first node falls within the predetermined range.

9. The oscillator circuit of claim 8 wherein the third inverting device has a trip point at a top end of the predetermined range, the trip point being greater than one-half of a supply voltage.

10. The oscillator circuit of claim 9 wherein the fourth inverting device has a trip point at a bottom end of the predetermined range, the trip point of the fourth inverting device being less than one-half of the supply voltage.

11. The oscillator circuit of claim 8 wherein the control circuit further includes a fifth inverting device that is connected to the third inverting device, the fifth inverting device outputting an enable signal to the fifth control transistor.

12. The oscillator circuit of claim 11 wherein the control circuit further includes a first logic circuit that is connected to the third inverting device, the first logic circuit outputting an enable signal to the sixth control transistor.

13. The oscillator circuit of claim 12 wherein the control circuit further includes a second logic circuit connected to the fourth inverting device, the second logic circuit outputting an enable signal to the first and third control transistors, and an enable signal to the second and fourth control transistors when the magnitude of the voltage on the first node is within the predetermined range.

14. The oscillator circuit of claim 1 wherein the control circuit includes:
a first inverting device connected to the first node, the first inverting device changing an output from a logic high to a logic low when the magnitude of the voltage on the first node exceeds the predetermined range; and
a second inverting device connected to the first node, the second inverting device changing an output from a logic high to a logic low when the magnitude of the voltage on the first node falls within the predetermined range.

15. The oscillator circuit of claim 14 wherein the first inverting device has a trip point at a top end of the predetermined range, the trip point being greater than one-half of a supply voltage.

16. The oscillator circuit of claim 15 wherein the second inverting device has a trip point at a lower end of the predetermined range, the trip point of the second inverting device being less than one-half of the supply voltage.

17. The oscillator circuit of claim 14 wherein the control circuit further includes a logic circuit connected to the second inverting device, the logic circuit enabling the first and third control transistors, and the second and fourth control transistors when the magnitude of the voltage on the first node falls within the predetermined range.

18. The oscillator circuit of claim 1 and further comprising a crystal circuit, the crystal circuit having:
a quartz crystal connected to the first and second nodes;
a bias resistor connected to the first and second nodes;
a first capacitor connected to the first node and ground; and
a second capacitor connected to the second node and ground.

19. The oscillator circuit of claim 6 and further comprising a crystal circuit, the crystal circuit having:
a quartz crystal connected to the first and second nodes;
a bias resistor connected to the first and second nodes;
a first capacitor connected to the first node and ground; and
a second capacitor connected to the second node and ground.

20. A device comprising:
an oscillator circuit having an input stage and an output stage connected to the input stage, the input stage receiving an oscillating signal, the output stage having a number of serially-connected inverting circuits, the inverting circuits of the output stage including a first inverting circuit and an last inverting circuit, each inverting circuit having an input and an output with opposite logic states; and
a gain stage having a number of serially-connected inverting circuits, the inverting circuits of the gain stage including a first inverting circuit and a last inverting circuit, the first inverting circuit of the gain stage having an input connected to an input of the first inverting circuit of the output stage, the last inverting circuit of the gain stage having an output connected to an output of the last inverting circuit of the output stage, each inverting circuit of the gain stage having an input and an output with opposite logic states.

21. The device of claim 20 and further comprising a control circuit connected to the input stage and the gain stage, the control circuit receiving the oscillating signal, electrically connecting the gain stage to a power supply line when the oscillating signal is less than an upper threshold voltage and greater than a lower threshold voltage, and electrically disconnecting the gain stage from the power supply line when the oscillating signal is greater than the upper threshold voltage.

22. The device of claim 21 wherein the control circuit electrically connects the gain stage to a ground line when the oscillating signal is less than an upper threshold voltage and greater than a lower threshold voltage, and electrically disconnects the gain stage from the ground line when the oscillating signal is greater than the upper threshold voltage.

23. The device of claim 21 wherein the control circuit includes:
an upper inverting circuit having an input and an output with opposite logic states, the input of the upper inverting circuit receiving the oscillating signal, the upper inverting circuit changing from one logic state to another when a voltage on the input of the upper inverting circuit exceeds the upper threshold voltage; and
a lower inverting circuit having an input and an output with opposite logic states, the input of the lower inverting circuit receiving the oscillating signal, the lower inverting circuit changing from one logic state to another when a voltage on the input of the lower inverting circuit exceeds the lower threshold voltage.

24. The device of claim 23 and further comprising a crystal circuit, the crystal circuit having:
a quartz crystal connected to the input stage, the upper inverting circuit, and the lower inverting circuit;
a bias resistor connected to the input stage, the upper inverting circuit, and the lower inverting circuit; and
a capacitor connected to the input stage, the upper inverting circuit, and the lower inverting circuit.

* * * * *